US012757621B2

(12) United States Patent
Kim et al.

(10) Patent No.: US 12,757,621 B2
(45) Date of Patent: Oct. 6, 2026

(54) DISPLAY DEVICE AND MANUFACTURING EQUIPMENT THEREOF

(71) Applicant: SAMSUNG DISPLAY CO., LTD., Yongin-si (KR)

(72) Inventors: Sanghoon Kim, Hwaseong-si (KR); Sang Min Yi, Suwon-si (KR); Jingul Kim, Seoul (KR); Jiyun Chun, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 385 days.

(21) Appl. No.: 18/596,931

(22) Filed: Mar. 6, 2024

(65) Prior Publication Data

US 2024/0215299 A1 Jun. 27, 2024

Related U.S. Application Data

(62) Division of application No. 17/340,244, filed on Jun. 7, 2021, now Pat. No. 11,950,446.

(30) Foreign Application Priority Data

Aug. 21, 2020 (KR) ........................ 10-2020-0105626

(51) Int. Cl.
*C23C 14/02* (2006.01)
*H10K 59/80* (2023.01)
*H10K 71/00* (2023.01)
*H10K 59/12* (2023.01)

(52) U.S. Cl.
CPC ........... *H10K 71/00* (2023.02); *H10K 59/873* (2023.02); *H10K 59/12* (2023.02)

(58) Field of Classification Search
CPC .............................. H10K 71/00; C23C 14/042
See application file for complete search history.

(56) References Cited

U.S. PATENT DOCUMENTS

| | | | | |
|---|---|---|---|---|
| 10,644,240 | B2 | 5/2020 | Kim | |
| 11,560,615 | B2 * | 1/2023 | Xu | H10K 71/166 |
| 2014/0145979 | A1 | 5/2014 | Lee | |
| 2015/0151850 | A1 | 6/2015 | Eakins | |

(Continued)

FOREIGN PATENT DOCUMENTS

| | | |
|---|---|---|
| JP | 2006-059599 | 3/2006 |
| KR | 1020190142460 | 12/2019 |
| KR | 1020200000521 | 1/2020 |

*Primary Examiner* — Ali Naraghi
(74) *Attorney, Agent, or Firm* — F. CHAU & ASSOCIATES, LLC

(57) ABSTRACT

A display device includes an electrode, a protection layer disposed on the electrode, and an encapsulation organic layer disposed on the protection layer. In a first area, an edge of the encapsulation organic layer is spaced a first distance from an edge of the electrode, and the edge of the encapsulation organic layer is spaced a second distance from an edge of the protection layer. In the second area, the edge of the encapsulation organic layer is disposed between the edge of the electrode and the edge of the protection layer. In the second area, the edge of the encapsulation organic layer is spaced a third distance, greater than the first distance, from the edge of the electrode, and the edge of the encapsulation organic layer is spaced a fourth distance, greater than the second distance, from the edge of the protection layer.

10 Claims, 12 Drawing Sheets

(56) References Cited

U.S. PATENT DOCUMENTS

| | | | |
|---|---|---|---|
| 2017/0117502 | A1 | 4/2017 | Park |
| 2018/0151850 | A1 | 5/2018 | Lee |
| 2019/0386221 | A1 | 12/2019 | Jang et al. |
| 2019/0393444 | A1 | 12/2019 | Nam et al. |
| 2020/0194714 | A1 | 6/2020 | Won et al. |
| 2020/0208255 | A1 | 7/2020 | Gaydos et al. |
| 2020/0208259 | A1 | 7/2020 | Shin et al. |
| 2021/0028256 | A1* | 1/2021 | Sonoda .................. H05B 33/12 |
| 2021/0066650 | A1 | 3/2021 | Yu et al. |
| 2021/0140061 | A1 | 5/2021 | Paik et al. |
| 2021/0371966 | A1* | 12/2021 | Niu ....................... C23C 14/042 |
| 2021/0404079 | A1* | 12/2021 | Xiao ....................... C23C 14/12 |
| 2022/0059800 | A1 | 2/2022 | Kim et al. |

* cited by examiner

DISPLAY DEVICE AND MANUFACTURING EQUIPMENT THEREOF

CROSS-REFERENCE TO RELATED APPLICATION

This application is a divisional of U.S. patent application Ser. No. 17/340,244 filed on Jun. 7, 2021, which claims priority under 35 U.S.C. § 119 to Korean Patent Application No. 10-2020-0105626, filed on Aug. 21, 2020, the disclosures of which are incorporated by reference herein in their entireties.

TECHNICAL FIELD

The inventive concept herein relates to a display device, and manufacturing equipment thereof, and more particularly, to a display device having an inspection area and manufacturing equipment including masks capable of providing a display device including an inspection area.

DISCUSSION OF RELATED ART

Various display devices that are used for multimedia devices, such as televisions, mobile phones, tablet computers, navigation units, or game consoles, have been developed. An example of a display device is a light emitting display device. In general, a light emitting element is disposed in each pixel of the light emitting display device.

The light emitting display device includes a conductive pattern and a plurality of insulation layers. The conductive pattern may be disposed between the plurality of insulation layers. Two or more insulation layers may be consecutively laminated.

SUMMARY

According to an embodiment of the inventive concept, a display device includes a base layer including a display area and a non-display area disposed at an outer side of the display area on a plane, a first electrode disposed on the display area, a light emitting layer disposed on the first electrode, a second electrode that overlaps the display area and the non-display area and is disposed on the light emitting layer, a protection layer that overlaps the display area and the non-display area and is disposed on the second electrode, and a thin-film encapsulation layer that overlaps the display area and the non-display area, is disposed on the protection layer, and includes an encapsulation organic layer. The non-display area includes a first area and a second area. In the first area, an edge of the encapsulation organic layer is spaced a first distance from an edge of the second electrode, and the edge of the encapsulation organic layer is spaced a second distance from an edge of the protection layer. In the second area, the edge of the encapsulation organic layer is disposed between the edge of the second electrode and the edge of the protection layer. In the second area, the edge of the encapsulation organic layer is spaced a third distance from the edge of the second electrode, and the edge of the encapsulation organic layer is spaced a fourth distance from the edge of the protection layer. The third distance is greater than the first distance, and the fourth distance is greater than the second distance.

In an embodiment of the inventive concept, in the first area and the second area, the edge of the encapsulation organic layer may be substantially linear.

In an embodiment of the inventive concept, the edge of the protection layer may include a concave area recessed toward the display area in the second area. The edge of the second electrode may include a convex area protruding toward an edge of the base layer in the second area.

In an embodiment of the inventive concept, the concave area of the edge of the protection layer may have a maximum width less than or equal to about 200 μm in the second area, and the convex area of the edge of the second electrode may have a maximum width less than or equal to about 200 μm in the second area.

In an embodiment of the inventive concept, in the first area, the edge of the protection layer may be disposed closest to the edge of the base layer among the edge of the second electrode, the edge of the protection layer, and the edge of the encapsulation organic layer, and in the first area, the edge of the encapsulation organic layer may be disposed farthest from the edge of the base layer among the edge of the second electrode, the edge of the protection layer, and the edge of the encapsulation organic layer.

In an embodiment of the inventive concept, the thin-film encapsulation layer may further include a first encapsulation inorganic layer and a second encapsulation inorganic layer, and the encapsulation organic layer may be disposed between the first encapsulation inorganic layer and the second encapsulation inorganic layer in a thickness direction of the base layer.

In an embodiment of the inventive concept, an edge of the first encapsulation inorganic layer and an edge of the second encapsulation inorganic layer may be substantially linear in the first area and the second area.

In an embodiment of the inventive concept, each of an edge of the first encapsulation inorganic layer and an edge of the second encapsulation inorganic layer may be closer to an edge of the base layer than the edge of the encapsulation organic layer in the first area and the second area.

In an embodiment of the inventive concept, the protection layer may include an organic material.

In an embodiment of the inventive concept, a display device includes a base layer including a display area and a non-display area disposed at an outer side of the display area on a plane, a first electrode disposed on the display area, a light emitting layer disposed in correspondence to the first electrode, a second electrode that overlaps the display area and the non-display area and is disposed on the light emitting layer, a protection layer that overlaps the display area and the non-display area and is disposed on the second electrode, and a thin-film encapsulation layer that overlaps the display area and the non-display area and include a first encapsulation inorganic layer, an encapsulation organic layer disposed on the first encapsulation inorganic layer, and a second encapsulation inorganic layer disposed on the encapsulation organic layer. In the non-display area, an edge of the protection layer includes a concave area recessed toward the display area, and an edge of the second electrode includes a convex area protruding toward an edge of the base layer. The concave area and the convex area are aligned with each other in a first direction, and in the first direction, an edge of the encapsulation organic layer is disposed between an edge of the concave area of the edge of the protection layer and an edge of the convex area of the edge of the second electrode.

In an embodiment of the inventive concept, manufacturing equipment includes a first mask configured to deposit a first material on each of unit areas of a working substrate, and a second mask configured to deposit a second material on each of the unit areas of the working substrate. The first mask includes a first mask sheet including first elements and second elements, and the first elements and the second elements define a plurality of first deposition openings corresponding to the unit areas, and the second mask includes a second mask sheet including third elements and fourth elements, and the third elements and the fourth elements define a plurality of second deposition openings corresponding to the unit areas. The first elements and the third elements each extend in a first direction, and the second elements and the fourth elements each extend in a second direction crossing the first direction. On a plane, a concave area is provided in at least each of the first elements or each of the second elements. On the plane, a convex area is provided in at least each of the third elements or each of the fourth elements at a position corresponding to the concave area.

In an embodiment of the inventive concept, the first mask may further include a first frame coupled to the first mask sheet, and the second mask may further include a second frame coupled to the second mask sheet.

In an embodiment of the inventive concept, the first mask sheet and the first frame may include the same material as each other.

In an embodiment of the inventive concept, at least the first elements or the second elements may include a first area having a first thickness and a second area having a second thickness less than the first thickness.

In an embodiment of the inventive concept, the concave area may be disposed in the first area.

In an embodiment of the inventive concept, each of the first elements may have a length greater than that of each of the second elements.

In an embodiment of the inventive concept, each of the plurality of first deposition openings may have a first surface area, and each of the plurality of second deposition openings may have a second surface area different from the first surface area.

In an embodiment of the inventive concept, the first material may include a metal material, and the second material may include an organic material.

In an embodiment of the inventive concept, the manufacturing equipment may further include a third mask configured to deposit a third material on each of the unit areas of the working substrate. The third mask may include fifth elements and sixth elements, and the fifth elements and the sixth elements may define a plurality of third deposition openings corresponding to the unit areas.

In an embodiment of the inventive concept, each of the fifth elements may have a uniform width, and each of the sixth elements may have a uniform width.

According to an embodiment of the inventive concept, a display device includes a base layer including a display area and a non-display area disposed at an outer side of the display area on a plane, an electrode that overlaps the display area and the non-display area, a protection layer that overlaps the display area and the non-display area and is disposed on the electrode, and a thin-film encapsulation layer that overlaps the display area and the non-display area and includes a first encapsulation inorganic layer, a second encapsulation inorganic layer, and an encapsulation organic layer disposed between the first encapsulation inorganic layer and the second encapsulation inorganic layer in a thickness direction of the display device. The display device includes a first area and a second area. In the first and second areas, edges of the first encapsulation inorganic layer and the second encapsulation inorganic layer are disposed between an edge of the base layer and an edge of the encapsulation organic layer in a first direction crossing the thickness direction. In the first area, an edge of the electrode is disposed between an edge of the protection layer and the edge of the encapsulation organic layer in the first direction. In the second area, the edge of the encapsulation organic layer is disposed between the edge of the electrode and the edge of the protection layer in the first direction.

BRIEF DESCRIPTION OF THE DRAWINGS

The above and other features of the inventive concept will be more fully understood by describing in detail exemplary embodiments thereof with reference to the accompanying drawings.

DETAILED DESCRIPTION OF THE EMBODIMENTS

Figure 1:
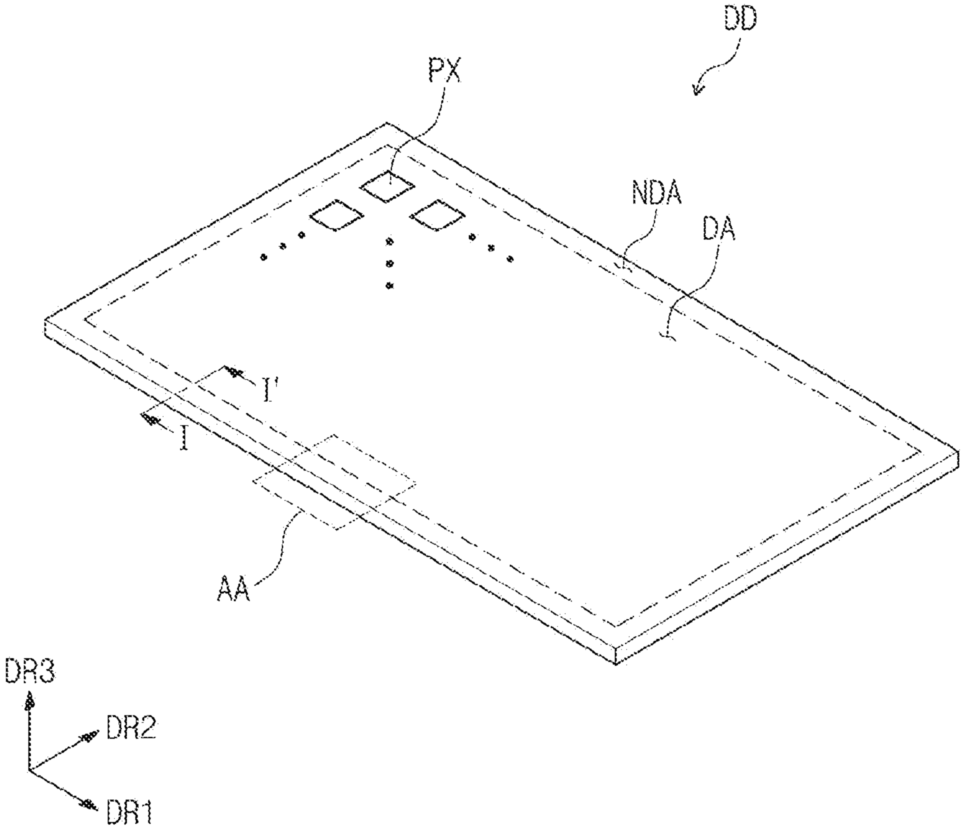
FIG. 1 is a perspective view of a display device according to an embodiment of the inventive concept.

Embodiments of the inventive concept provide a display device including an inspection area of an insulation layer.

Embodiments of the inventive concept also provide manufacturing equipment including masks capable of providing a display device including an inspection area.

Embodiments of the inventive concept will be described more fully hereinafter with reference to the accompanying drawings. Like reference numerals may refer to like elements throughout this application.

It will be understood that when an element such as a region, layer, or portion is referred to as being "on" another element, it can be directly on the other element or intervening elements may also be present.

Additionally, in the drawings, the thickness, ratio, and dimensions of components may be exaggerated for clarity of illustration. Spatially relative terms, such as “below”, “lower”, “above”, and “upper”, may be used herein for ease of description to describe an element and/or a feature’s relationship to another element(s) and/or feature(s), as illustrated in the drawings. The terms may be a relative concept and described based on directions expressed in the drawings.

The meaning of ‘include’ or ‘comprise’ specifies a property, a region, a fixed number, a step, a process, an element, and/or a component, but does not exclude other properties, regions, fixed numbers, steps, processes, elements, and/or components.

Figure 2:
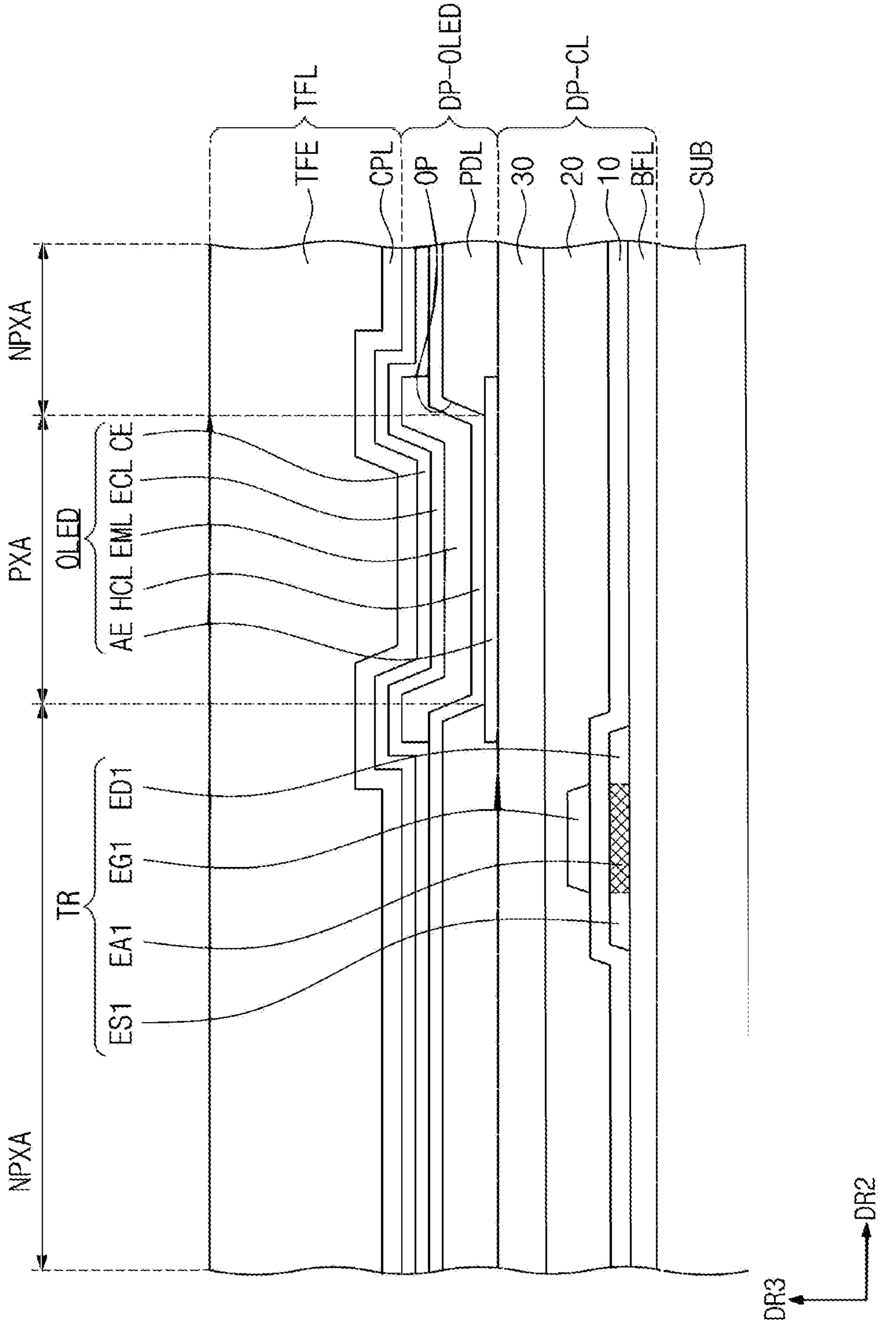
FIG. 2 is a cross-sectional view of the display device of FIG. 1 according to an embodiment of the inventive concept.
Figure 3:
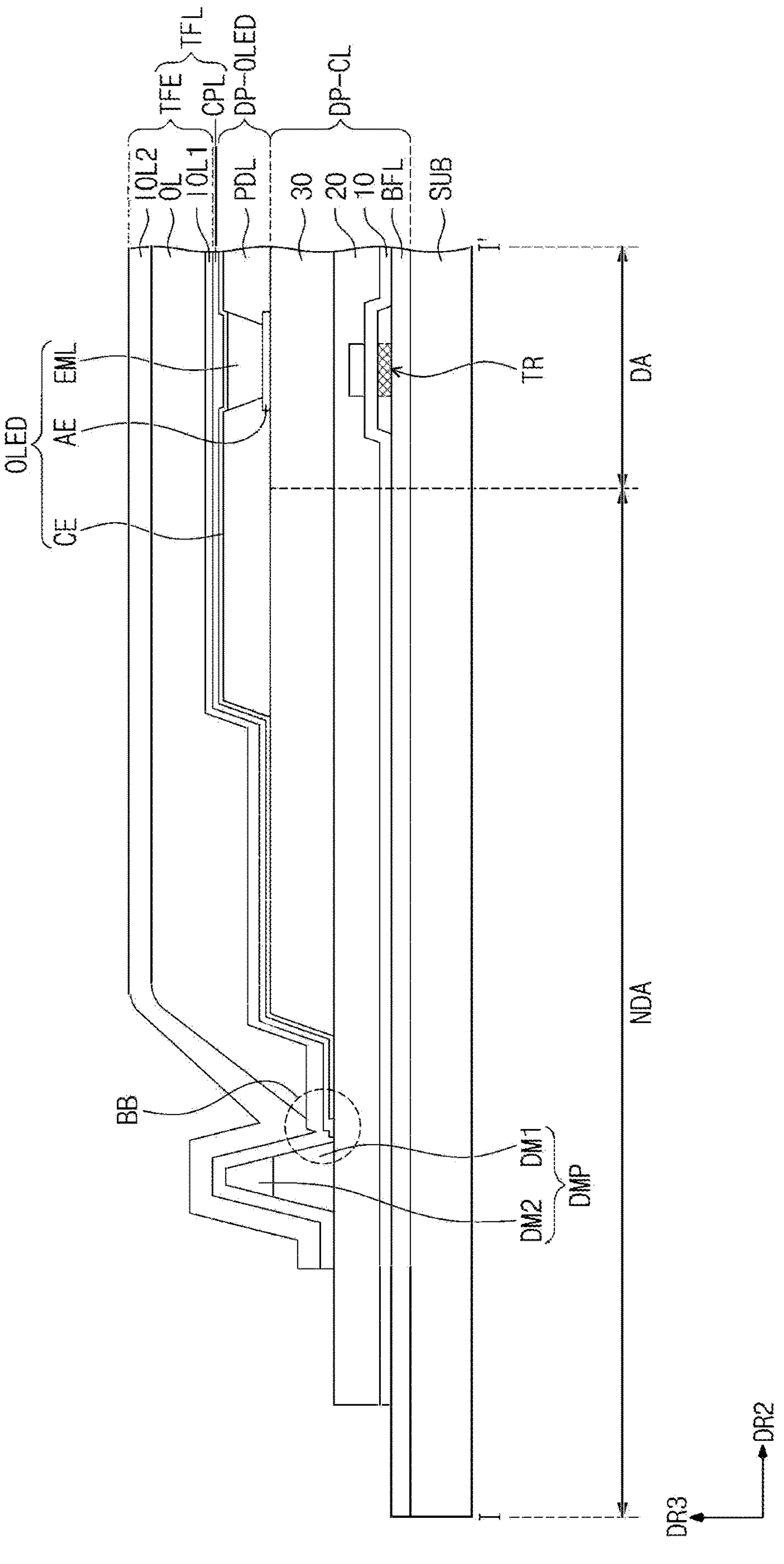
FIG. 3 is a cross-sectional view of the display device of FIG. 1 according to an embodiment of the inventive concept.

FIG. 1 is a perspective view illustrating a display device according to an embodiment of the inventive concept. FIG. 2 is a cross-sectional view illustrating the display device of FIG. 1 according to an embodiment of the inventive concept. FIG. 3 is a cross-sectional view illustrating the display device of FIG. 1 according to an embodiment of the inventive concept. FIG. 2 illustrates a cross-section corresponding to a pixel PX, and FIG. 3 illustrates a cross-section taken along a line I-I' of FIG. 1.

As illustrated in FIG. 1, a display device DD includes a display region DA and a non-display area NDA disposed outside the display area DA on a plane defined by a first directional axis DR1 and a second directional axis DR2 crossing the first directional axis DR1. A thickness direction of the display device DD indicates a third directional axis DR3 crossing the first directional axis DR1 and the second directional axis DR2. A front surface (or a top surface) and a rear surface (or a bottom surface) of each member are distinguished by the third directional axis DR3. However, directions indicated by the first to third directional axes DR1, DR2, and DR3 may be relative concepts and converted with respect to one another. Hereinafter, first to third directions are directions indicated by the first to third directional axes DR1, DR2, and DR3 and designated by the same reference numerals as the reference numerals of the first directional axis, the second direction axis, and the third directional axis, respectively.

The display device DD according to the present embodiment may be a flat rigid display device. However, the inventive concept is not limited thereto. For example, the display device DD according to an embodiment of the inventive concept may be a flexible display device. The display device DD according to embodiments of the inventive concept may be used for large-sized electronic devices such as televisions or monitors, and small and medium-sized electronic devices such as mobile phones, tablet computers, or navigation units for vehicles, game consoles, and smart watches.

As illustrated in FIG. 1, a plurality of pixels PX may be disposed in the display area DA. The pixels PX are not disposed in the non-display area NDA.

FIG. 2 illustrates a cross-section corresponding to a partial area of the pixel PX. The pixel PX may include a display element and a driving circuit allowing the display element to operate. The display element may be a light emitting element and include a light emitting diode. The driving circuit may include a plurality of transistors and at least one capacitor. FIG. 2 exemplarily illustrates an organic light emitting diode OLED as the light emitting element and one transistor TR as the driving circuit.

The display device DD includes a base layer SUB, a circuit element layer DP-CL, a display element layer DP-OLED, and an upper insulation layer TFL. The base layer SUB may include a synthetic resin layer. The synthetic resin layer is disposed on a support substrate that is used when the display device DD is manufactured. Thereafter, a conductive layer, an insulation layer, etc., are provided on the synthetic resin layer. When the support substrate is removed, the synthetic resin layer corresponds to the base layer SUB.

The circuit element layer DP-CL includes at least one inorganic layer, at least one organic layer, and a circuit element. The circuit element layer DP-CL may include a buffer layer BFL that is an inorganic layer, a first insulation layer 10, a second insulation layer 20, and a third insulation layer 30. Each of the first insulation layer 10 and the second insulation layer 20 may include an inorganic layer, and the third insulation layer 30 may include an organic layer.

A semiconductor pattern is disposed on the buffer layer BFL. The semiconductor pattern may include a silicon semiconductor. The semiconductor pattern may include polysilicon. However, the inventive concept is not limited thereto. For example, the semiconductor pattern may include amorphous silicon or a metal oxide semiconductor.

The semiconductor pattern has an electrical property that is different according to whether it is doped or not. The semiconductor pattern may include a first area and a second area that is different from the first area. The first area may be doped with a n-type dopant or a p-type dopant. A p-type transistor includes a doped area that is doped with the p-type dopant.

The first area has a conductivity greater than that of the second area and substantially serves as an electrode or a signal line. The second area substantially corresponds to an active region (or a channel) of the transistor. In other words, one portion of the semiconductor pattern may be the active region (or the channel) of the transistor, another portion may be a source (or an input electrode region) or a drain (or an output electrode region) of the transistor, and another portion may be a connection signal line (or a connection electrode).

As illustrated in FIG. 2, a source ES1, an active region EA1, and a drain ED1 of the transistor TR are provided from the semiconductor pattern. The transistor TR may be connected to the organic light emitting diode OLED through a different conductive structure. For example, the driving circuit may include a plurality of transistors, and another transistor may be directly connected to the organic light emitting diode OLED.

A control electrode EG1 is disposed on the first insulation layer 10 to overlap the active region EA1. The second insulation layer 20 covers the control electrode EG1.

The display element layer DP-OLED is disposed on the third insulation layer 30. The display element layer DP-OLED may include a pixel defining layer PDL and the organic light emitting diode OLED. The pixel defining layer PDL may include an organic material. A first electrode AE is disposed on the third insulation layer 30. An opening OP is defined in the pixel defining layer PDL. The opening OP of the pixel defining layer PDL exposes at least a portion of the first electrode AE.

The exposed portion of the first electrode AE may be referred to as a light emitting area PXA. A non-light emitting area NPXA may be disposed adjacent to the light emitting area PXA. A hole control layer HCL may be disposed on the light emitting area PXA and the non-light emitting area NPXA in common, e.g., both the light emitting area PXA and the non-light emitting area NPXA. The hole control layer HCL includes a hole transport layer. The hole control layer HCL may further include a hole injection layer. A common layer such as the hole control layer HCL may be disposed in the plurality of pixels PX (refer to FIG. 1) in common.

A light emitting layer EML is disposed on the hole control layer HCL. The light emitting layer EML may be disposed on an area corresponding to the opening OP. In the present embodiment of the inventive concept, the light emitting layer EML may be divided and disposed in each of the plurality of pixels PX. The light emitting layer EML may include an organic material and/or an inorganic material. Although the patterned light emitting layer EML is exemplarily illustrated in the present embodiment, the light emitting layer EML may be disposed in the plurality of pixels PX (refer to FIG. 1) in common. In this case, the light emitting layer EML may generate white light or blue light.

An electron control layer ECL is disposed on the light emitting layer EML. The electron control layer ECL may be disposed in the plurality of pixels PX (refer to FIG. 1) in common. The electron control layer ECL includes an electron transport layer. The electron control layer ECL may further include an electron injection layer.

A second electrode CE is disposed on the electron control layer ECL. The second electrode CE is disposed in the plurality of pixels PX (refer to FIG. 1) in common.

The upper insulation layer TFL is disposed on the second electrode CE. The upper insulation layer TFL may include a protection layer CPL and a thin-film encapsulation layer TFE. The protection layer CPL directly covers the second electrode CE and protects the second electrode CE in a following process. The protection layer CPL may include an organic material.

The thin-film encapsulation layer TFE is disposed in the plurality of pixels PX (refer to FIG. 1) in common. The thin-film encapsulation layer TFE includes a plurality of insulation layers. The thin-film encapsulation layer TFE protects the organic light emitting diode OLED against moisture and foreign substances.

In FIG. 3, since the circuit element layer DP-CL and the display element layer DP-OLED, which are disposed in the display area DA, have the same constitution as that described with reference to FIG. 2, a detailed description thereof will be omitted. The hole control layer HCL and the electron control layer ECL are not illustrated in FIG. 3.

Although FIG. 3 illustrates only a cross-section at one side in the second direction DR2, a cross-section at the other side in the second direction DR2 may be symmetric to that in FIG. 3. Here, the symmetry is a symmetry with respect to a comparative relationship of edges to be described below, rather than a mathematical symmetric feature. Hereinafter, when an edge is compared with another edge, it will be understood that an edge close to the display area DA is disposed at an inner side, and an edge away from the display area DA is disposed at an outer side.

The buffer layer BFL, the first insulation layer 10, the second insulation layer 20, and the third insulation layer 30 overlap the display area DA and the non-display area NDA of the base layer SUB. An edge of the base layer SUB is disposed at an outermost side. An edge of the buffer layer BFL, which is aligned to the edge of the base layer SUB, is exemplarily illustrated. Aligned edges of the first insulation layer 10 and the second insulation layer 20 are exemplarily illustrated. An edge of the third insulation layer 30 may be disposed at an innermost side among the above-described edges. An edge of the pixel defining layer PDL may be disposed at a further inner side. The edge of the pixel defining layer PDL overlaps the non-display area NDA.

A dam part DMP may be disposed at an outer side of the edge of the third insulation layer 30. The dam part DMP may have a multi-layered structure. A lower portion DM1 may be provided through the same process as the third insulation layer 30, and an upper portion DM2 may be provided through the same process as the pixel defining layer PDL. The dam part DMP restricts a liquefied organic material from spreading to the outside in a process of forming an encapsulation organic layer OL that will be described later.

The thin-film encapsulation layer TFE may include a first encapsulation inorganic layer IOL1, the encapsulation organic layer OL, and a second encapsulation inorganic layer IOL2, which are consecutively laminated. In other words, the encapsulation organic layer OL may be disposed between the first encapsulation inorganic layer IOL1 and the second encapsulation inorganic layer IOL2 in a thickness direction (e.g., DR3) of the display device DD. An edge of each of the first encapsulation inorganic layer IOL1 and the second encapsulation inorganic layer IOL2 may be disposed at an outer side further than that of the encapsulation organic layer OL. The first encapsulation inorganic layer IOL1 and the second encapsulation inorganic layer IOL2 may overlap the dam part DMP. The edge of each of the first encapsulation inorganic layer IOL1 and the second encapsulation inorganic layer IOL2 may be disposed at an inner side further than that of each of the first insulation layer 10 and the second insulation layer 20.

Referring to FIG. 3, the encapsulation organic layer OL, the second electrode CE, and the protection layer CPL overlap the display area DA and the non-display area NDA. Referring to a predetermined area BB in FIG. 3, it may be known that edges of the encapsulation organic layer OL, the second electrode CE, and the protection layer CPL are not aligned but disposed adjacent to each other. This means that the edges of the encapsulation organic layer OL, the second electrode CE, and the protection layer CPL are hardly distinguishable by the naked eye. The second electrode CE and the protection layer CPL may be provided through a deposition method, and the encapsulation organic layer OL may be provided through an ink-jet method. As the edges are hardly distinguishable, a limitation of hardly distinguishing, e.g., identifying, a manufacturing defect may occur. Hereinafter, a distinguishable inspection area of the display device DD according to an embodiment of the inventive concept will be described in detail.

Figure 4A:
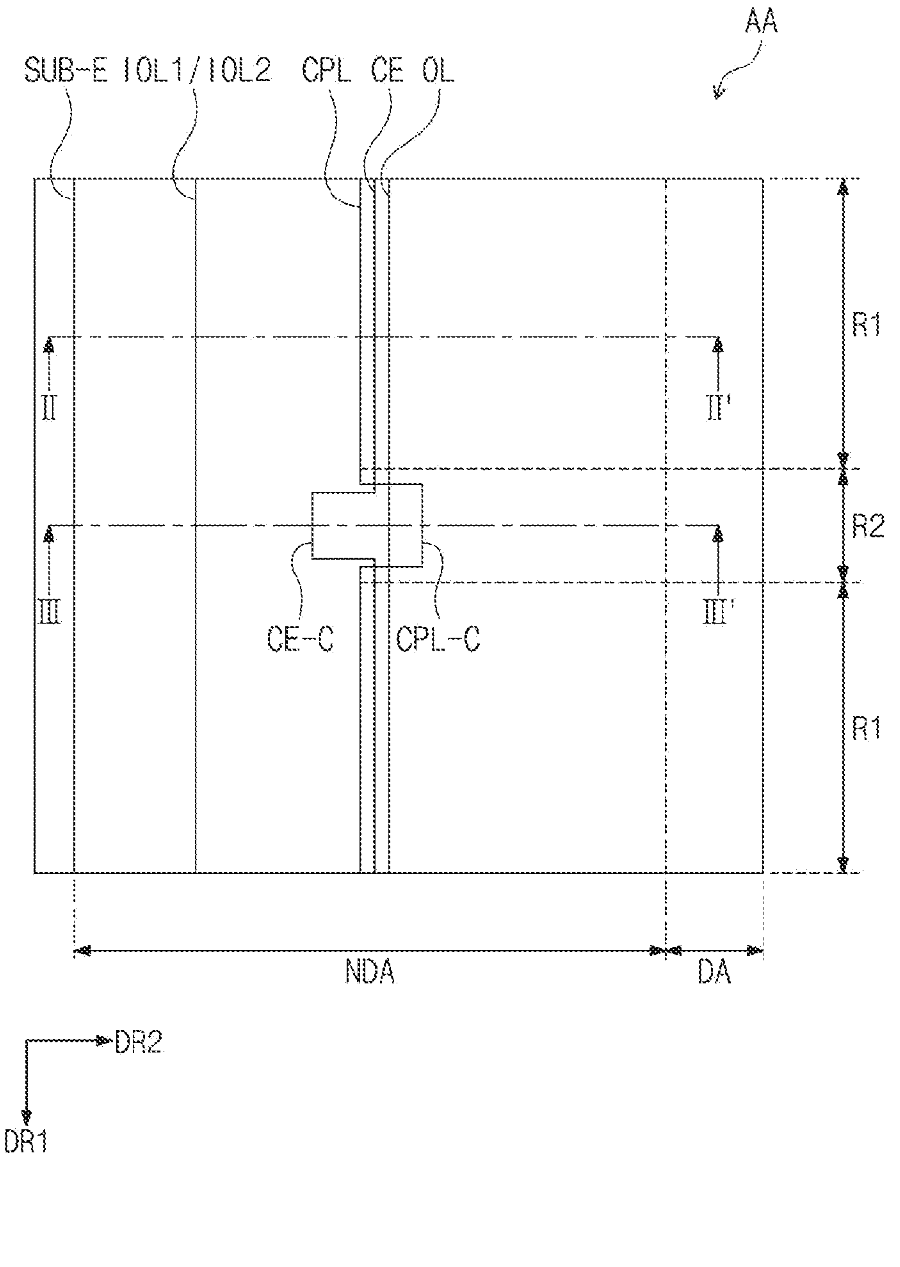
FIG. 4A is a plan view illustrating a partial area of the display device of FIG. 1 according to an embodiment of the inventive concept.
Figure 4B:
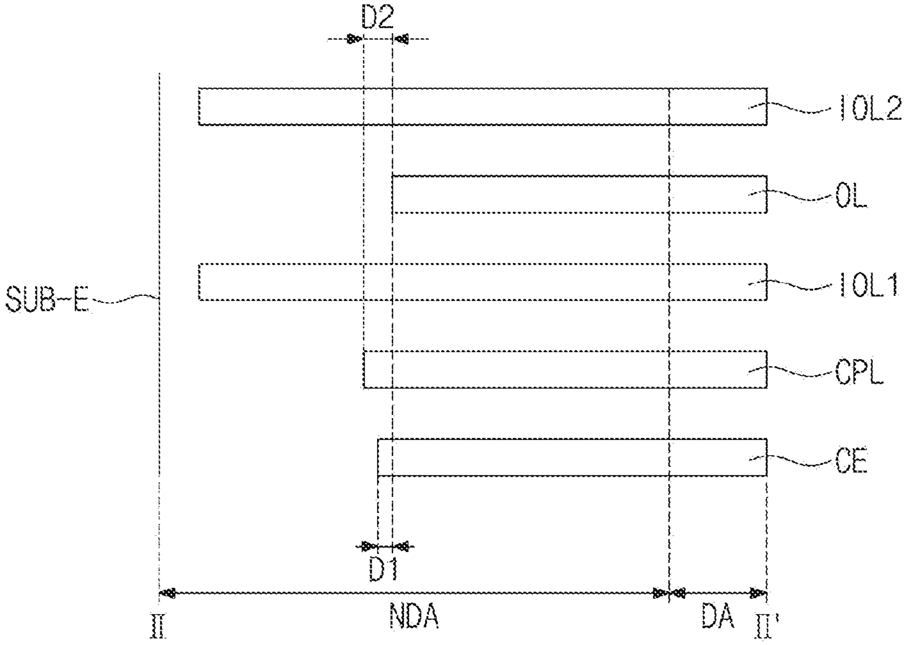
FIG. 4B is a cross-sectional view of the partial area of the display device of FIG. 4A according to an embodiment of the inventive concept.
Figure 4C:
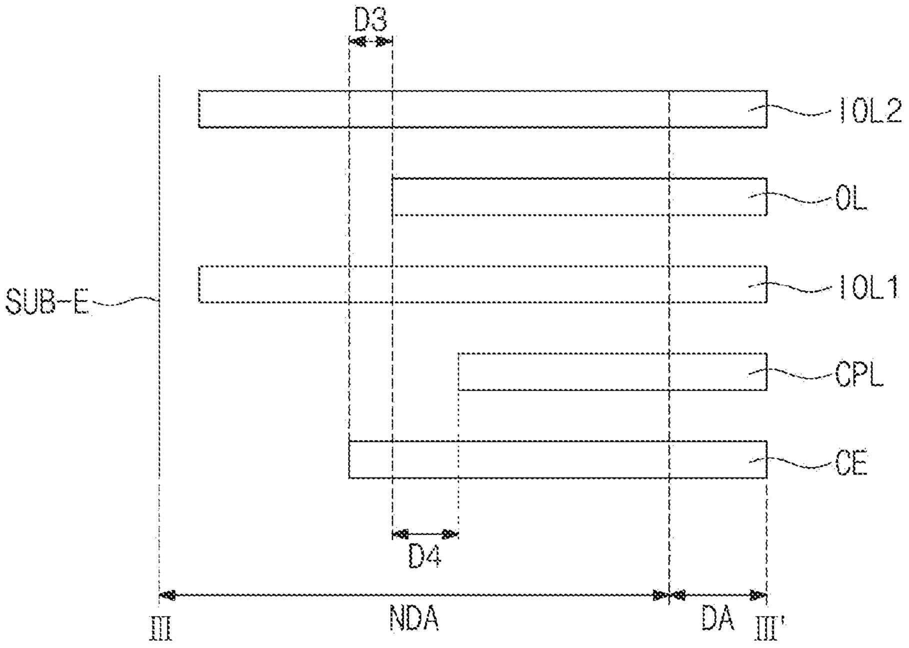
FIG. 4C is a cross-sectional view of the partial area of the display device of FIG. 4A according to an embodiment of the inventive concept.

FIG. 4A is a plan view illustrating a partial area AA of the display device of FIG. 1 according to an embodiment of the inventive concept. FIG. 4B is a cross-sectional view taken along line II-II' of the partial area AA of the display device of FIG. 4A according to an embodiment of the inventive concept. FIG. 4C is a cross-sectional view taken along line III-III' of the partial area AA of the display device of FIG. 4A according to an embodiment of the inventive concept.

In the first direction DR1, the non-display area NDA may include a first area R1 and a second area R2. In the first area R1, the edges of the encapsulation organic layer OL, the second electrode CE, and the protection layer CPL are disposed relatively more adjacent to one another. In the second area R2, the edges of the encapsulation organic layer OL, the second electrode CE, and the protection layer CPL are disposed relatively more away from one another. Through the distinguishable edges of the encapsulation organic layer OL, the second electrode CE, and the protection layer CPL, it may be known whether the layers are provided appropriately according to design values. The second area R2 corresponds to the above-described inspection area.

Referring to FIGS. 4A and 4B, the edges of the encapsulation organic layer OL, the second electrode CE, and the protection layer CPL are disposed adjacent to one another in the first area R1. It is exemplarily illustrated that the edge of the protection layer CPL is disposed at an outermost side, and the edge of the encapsulation organic layer OL is disposed at an innermost side among the above-described edges. In other words, the edge of the protection layer CPL is closest to an edge SUB-E of the base layer SUB, and the edge of the encapsulation organic layer OL is farthest from the edge SUB-E of the base layer SUB. Here, in the first area R1, the edge of the encapsulation organic layer OL is spaced a first distance D1 from the edge of the second electrode CE, and the edge of the encapsulation organic layer OL is spaced a second distance D2 from the edge of the protection layer CPL. In other words, in the first area R1, the edge of the second electrode CE is disposed between the edge of the protection layer CPL and the edge of the encapsulation organic layer OL in the second direction DR2.

Referring to FIGS. 4A and 4C, the edges of the encapsulation organic layer OL, the second electrode CE, and the protection layer CPL are disposed relatively away from each other in the second area R2. Among the above-described three edges, the edge of the second electrode CE is disposed at an outermost side, and the edge of the protection layer CPL is disposed at an innermost side. In other words, among the above-described three edges, the edge of the second electrode CE is closest to the edge SUB-E of the base layer SUB, and the edge of the protection layer CPL is farthest from the edge SUB-E of the base layer SUB. In the second area R2, the edge of the encapsulation organic layer OL is disposed between the edge of the second electrode CE and the edge of the protection layer CPL. Here, in the second area R2, the edge of the encapsulation organic layer OL is spaced a third distance D3 greater than the first distance D1 from the edge of the second electrode CE, and the edge of the encapsulation organic layer OL is spaced a fourth distance D4 greater than the second distance D2 from the edge of the protection layer CPL. In other words, in the second area R2, the edge of the encapsulation organic layer OL may be disposed between the edge of the second electrode CE and the edge of the protection layer CPL in the second direction DR2.

The third distance D3 different from the first distance D1 and the fourth distance D4 different from the second distance D2 are generated because the edge of the second electrode CE and the edge of the protection layer CPL are not linear on a plane as illustrated in FIG. 4A. However, the edge of the encapsulation organic layer OL is substantially linear in the first area R1 and the second area R2. In the first area R1 and the second area R2, the edge of the encapsulation organic layer OL is parallel to the first direction DR1. In the first area R1 and the second area R2, the edge of each of the first encapsulation inorganic layer IOL1 and the second encapsulation inorganic layer IOL2 may be substantially linear and disposed closer to the edge SUB-E of the base layer SUB than the edge of the encapsulation organic layer OL. In other words, in the first and second areas R1 and R2, the edges of the first encapsulation inorganic layer IOL1 and the second encapsulation inorganic layer IOL2 may be disposed between the edge SUB-E of the base layer SUB and the edge of the encapsulation organic layer OL in the second direction DR2.

In the second area R2, the edge of the protection layer CPL may include a concave area CPL-C recessed toward the display area DA, and the edge of the second electrode CE may include a convex area CE-C protruding toward the edge SUB-E of the base layer SUB. Through the above-described inspection area, the edge of the encapsulation organic layer OL may be checked by the naked eye. In the second area R2, it may be determined whether the edge of the encapsulation organic layer OL is disposed appropriately between the edge of the protection layer CPL and the edge of the second electrode CE, and the encapsulation organic layer OL provided through an ink-jet process may be evaluated to determine whether the encapsulation organic layer OL is provided within an error range.

Here, since the convex area CE-C is disposed in the second electrode CE, a noise shielding area of the second electrode CE is not reduced. Referring to FIG. 3, although the signal lines disposed on the same layer as the transistor TR are disposed in the non-display area NDA, signals generated from the signal lines may be prevented from causing noise. Since the concave area CPL-C is disposed in the protection layer CPL that is an organic layer, the concave area CPL-C may be sufficiently sealed by the first encapsulation inorganic layer IOL1. In FIG. 3, the first encapsulating inorganic layer IOL1 is widely deposited to cover the dam portion DMP. In an embodiment of the inventive concept, even if the first encapsulation inorganic layer IOL1 is deposited somewhat narrower than that shown in FIG. 3, an adverse effect by the concave region CPL-C is not caused when the protection layer CPL is sealed by the first encapsulation inorganic layer IOL1.

Although a width in the first direction DR1 of the convex area CE-C of the edge of the second electrode CE is narrower than a width in the first direction DR1 of the concave area CPL-C of the edge of the protection layer CPL, the inventive concept is not limited thereto. For example, the opposite case may be possible, or the width in the first direction DR1 of the convex area CE-C of the edge of the second electrode CE may be the same as that of the concave area CPL-C of the edge of the protection layer CPL. In an embodiment of the inventive concept, a maximum width in the first direction DR1 of the concave area CPL-C of the edge of the protection layer CPL may be less than or equal to about 200 μm, and a maximum width in the first direction DR1 of the convex area CE-C of the edge of the second electrode CE may be less than or equal to about 200 μm. In an embodiment of the inventive concept, a maximum depth in the second direction DR2 of the concave area CPL-C of the edge of the protection layer CPL may be less than or equal to about 200 μm, and a maximum depth in the second direction DR2 of the convex area CE-C of the edge of the second electrode CE may be less than or equal to about 200 μm.

Referring to FIG. 4A, although the concave area CPL-C of the edge of the protection layer CPL and a linear area of the edge of the protection layer CPL are continuous in the first direction DR1, the inventive concept is not limited thereto. For example, a boundary area may be further disposed between the concave area CPL-C of the edge of the protection layer CPL and the linear area of the edge of the protection layer CPL. The boundary area may include a diagonal edge or a curved edge. Likewise, a boundary area may be further disposed between the convex area CE-C of the edge of the second electrode CE and a linear area of the edge of the second electrode CE.

Figure 5:
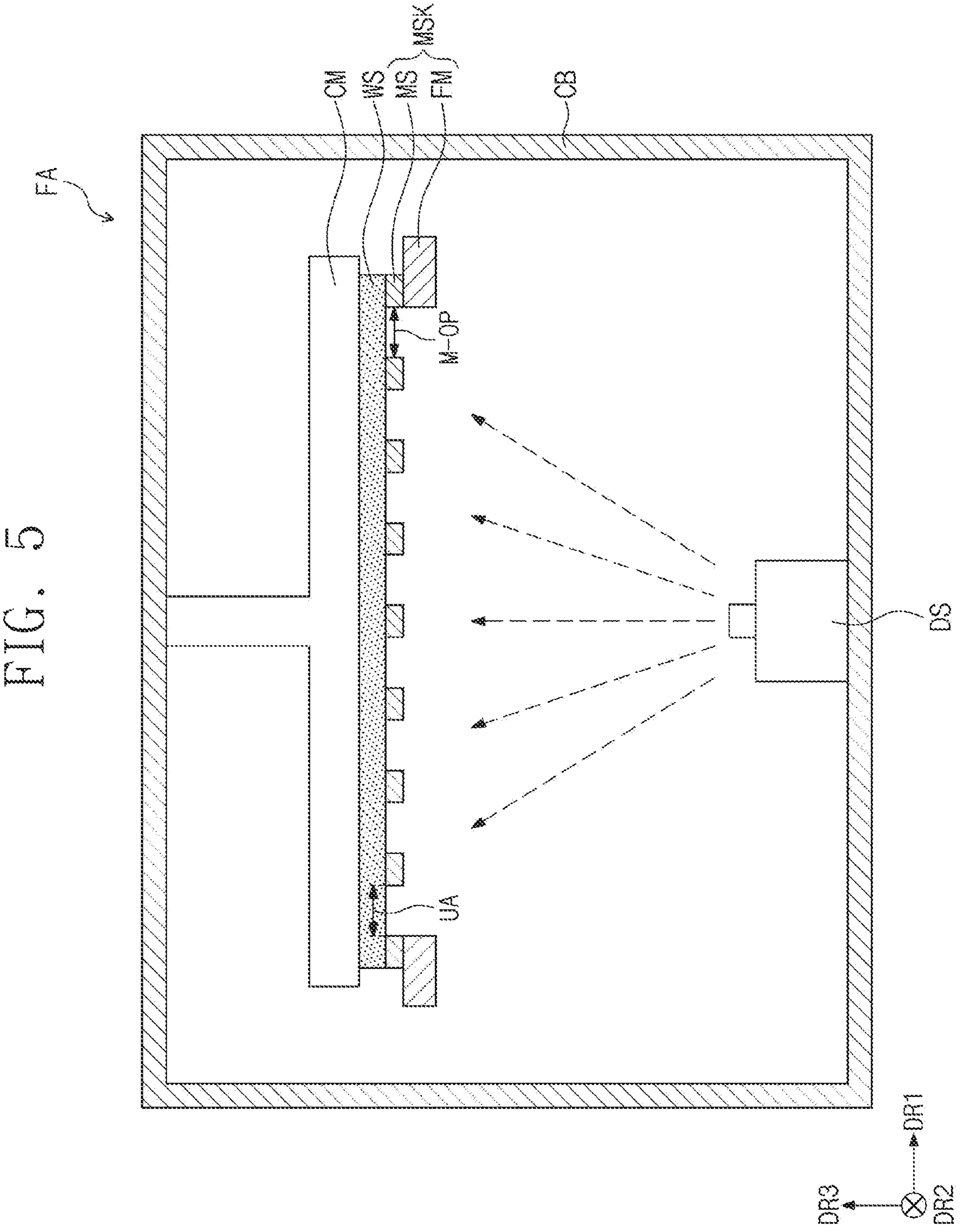
FIG. 5 is a view illustrating manufacturing equipment according to an embodiment of the inventive concept.
Figure 6:
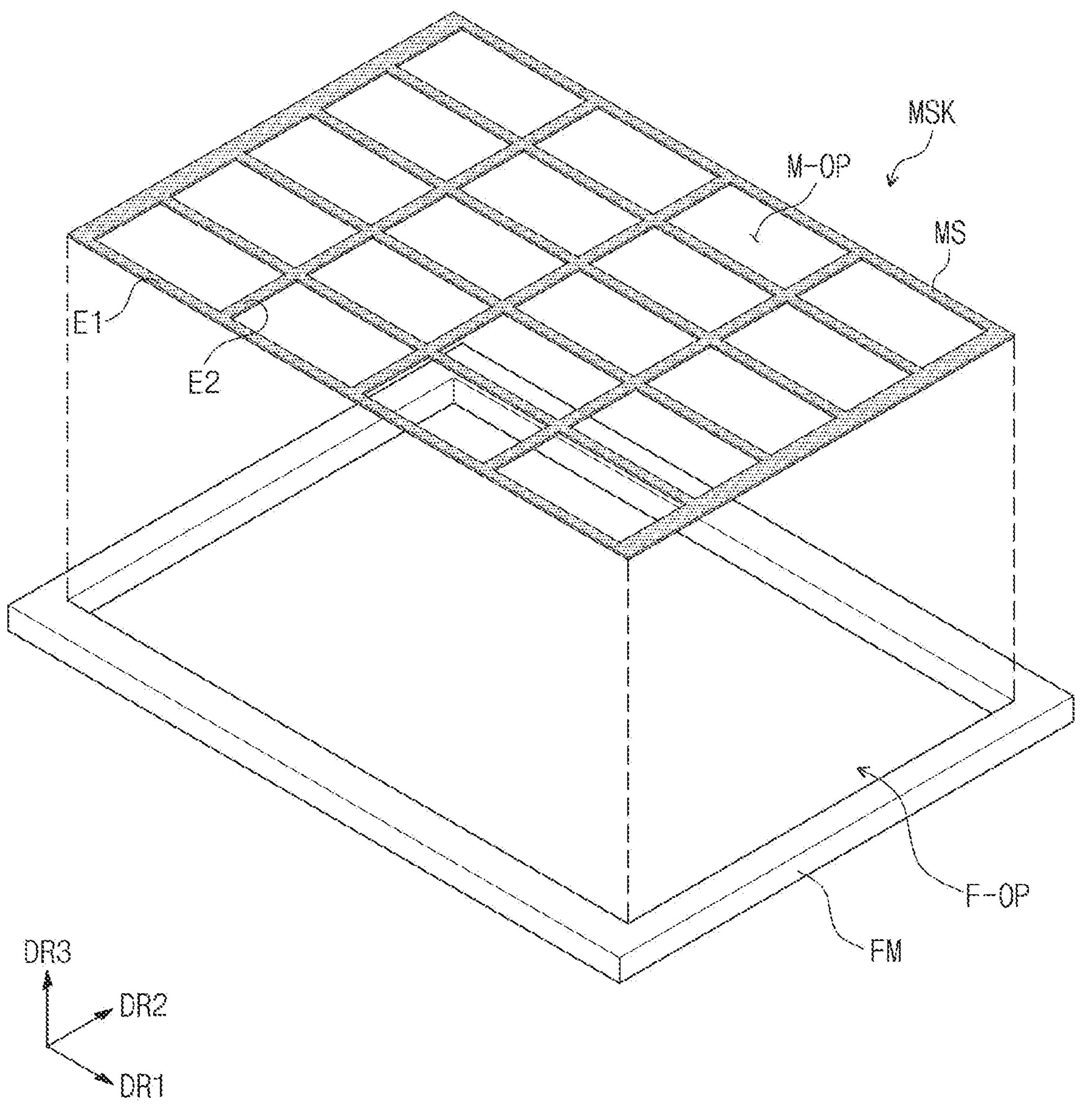
FIG. 6 is an exploded perspective view of a mask according to an embodiment of the inventive concept.
Figure 7A:
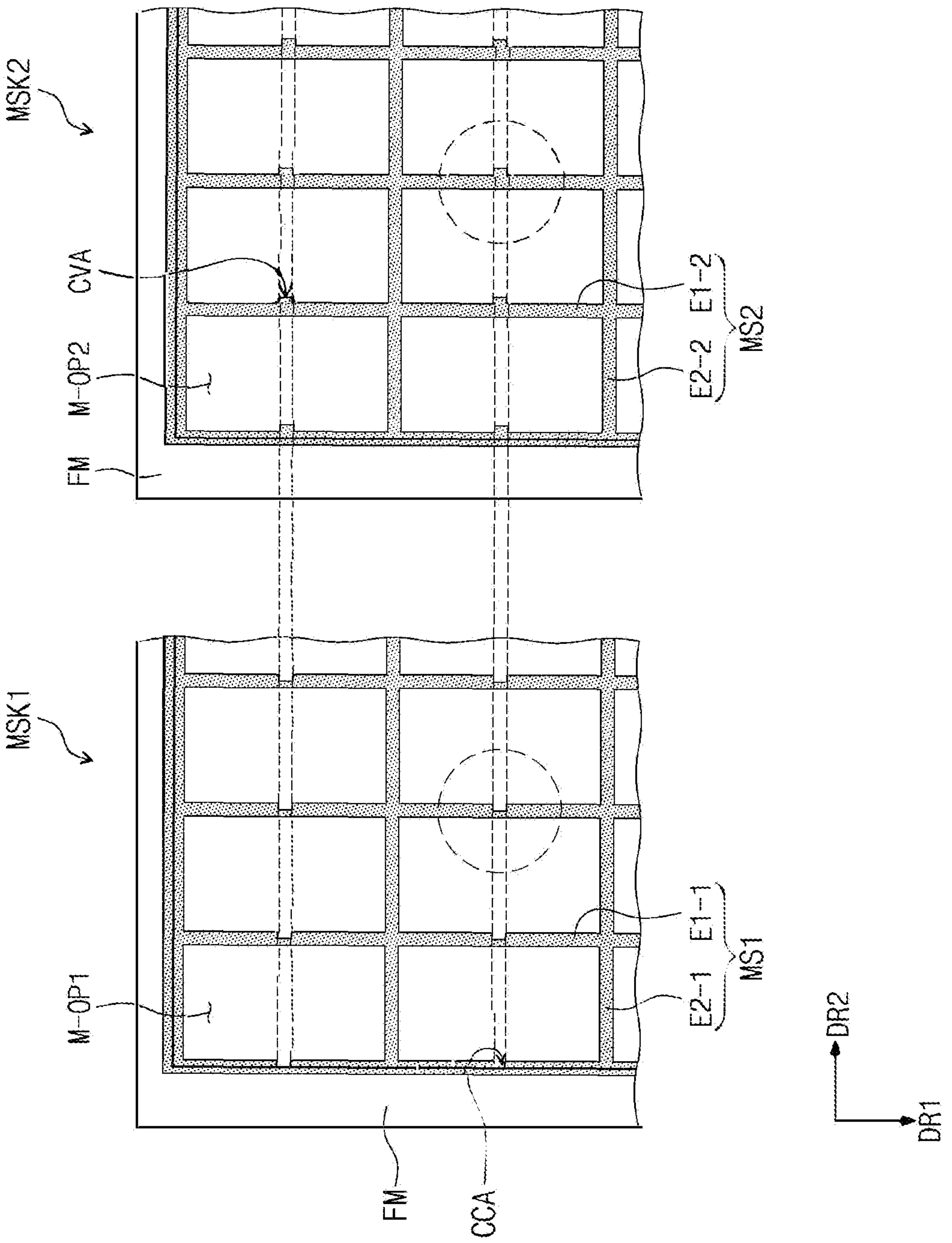
FIGS. 7A and 7B are plan views comparatively illustrating a first mask and a second mask according to embodiments of the inventive concept.
Figure 7B:
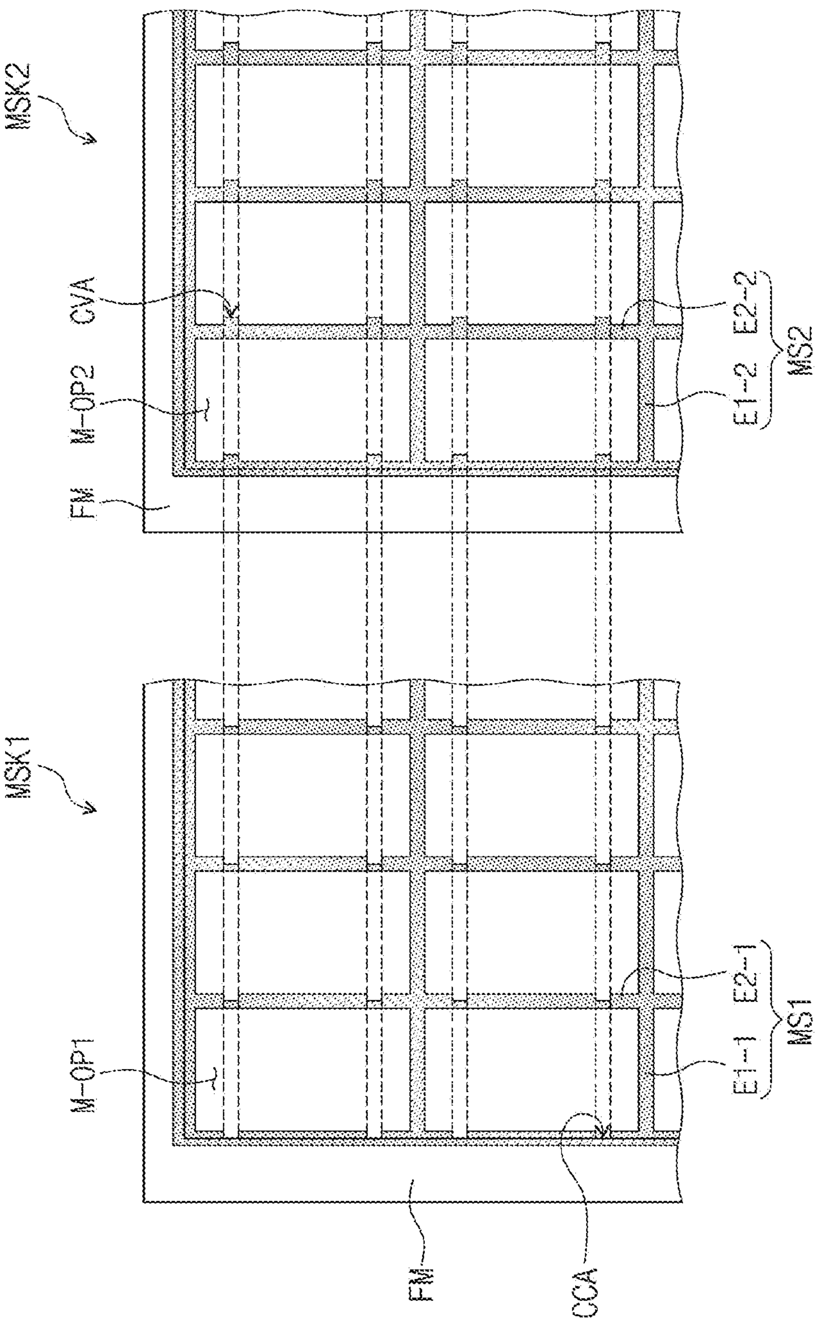

FIG. 5 is a view illustrating manufacturing equipment according to an embodiment of the inventive concept. FIG. 6 is an exploded perspective view of a mask according to an embodiment of the inventive concept. FIGS. 7A and 7B are plan views comparatively illustrating a first mask and a second mask according to embodiments of the inventive concept.

FIG. 5 illustrates one deposition equipment FA as an example of the manufacturing equipment. The deposition equipment FA may be used to form a conductive layer (conductive pattern) or the insulation layer of the display device DD described with reference to FIGS. 1 to 3. The deposition equipment FA includes a deposition chamber CB, a fixing member CM, a deposition source DS disposed inside the deposition chamber CB, and a mask MSK disposed inside the deposition chamber CB. The manufacturing equipment according to an embodiment of the inventive concept may include a plurality of deposition equipment FA in FIG. 5. The manufacturing equipment may further include an additional mechanical device for realizing an in-line system.

The deposition chamber CB may be set a deposition condition to vacuum. The deposition chamber CB may include a bottom surface, a ceiling surface, and sidewalls. The bottom surface of the deposition chamber CB may be substantially parallel to a surface defined by the first directional axis DR1 and the second directional axis DR2. A normal direction of the bottom surface of the deposition chamber CB indicates the third directional axis DR3. As discussed above, first to third directions may be directions indicated by the first to third directional axes DR1, DR2, and DR3, respectively, and designated by the same reference numerals as the reference numerals of the first directional axis, the second directional axis, and the third directional axis, respectively. Hereinafter, an expression "on a plane" represents a surface substantially parallel to the surface defined by the first directional axis DR1 and the second directional axis DR2.

The fixing member CM is disposed inside the deposition chamber CB and disposed above the deposition source DS to fix the mask MSK. The fixing member CM may be installed on the ceiling surface of the deposition chamber CB. The fixing member CM may include a jig or a robot arm holding the mask MSK.

The fixing member CM may include a body part and magnetic bodies coupled to the body part. The body part may include a plate as a base structure for fixing the mask MSK. However, the inventive concept is not limited thereto. The magnetic bodies may be disposed inside or outside the body part. The magnetic bodies may fix the mask MSK by using a magnetic force.

The deposition source DS may evaporate a deposition material such as an organic material, an inorganic material, or a metal material to be ejected as deposition vapor. The deposition vapor passes through the mask MSK and is deposited on a working substrate WS with a predetermined pattern.

The mask MSK is disposed inside the deposition chamber CB and disposed above the deposition source DS to support the working substrate WS. The mask MSK includes a plurality of deposition openings M-OP. The working substrate WS includes a plurality of unit areas UA corresponding to the plurality of deposition openings M-OP. Each of the plurality of unit areas UA finally constitutes the display device DD described with reference to FIGS. 1 to 3 when a manufacturing process is completed.

The working substrate WS may include a glass substrate or a plastic substrate. The working substrate WS may include a synthetic resin layer disposed on the base substrate. The base substrate may be removed in the latter half of the process for manufacturing the display device DD, and the synthetic resin layer may correspond to the base layer SUB in FIG. 2.

Referring to FIGS. 5 and 6, the mask MSK may include a frame FM defining an opening F-OP and a mask sheet MS coupled to the frame FM. The mask sheet MS may be coupled to, e.g., welded to, the frame to overlap the opening F-OP. The mask sheet MS may include first elements E1 and second elements E2 defining the plurality of deposition openings M-OP. In an embodiment of the inventive concept, the first elements E1 that are longitudinal elements are greater in length than the second elements E2 that are transverse elements. However, the inventive concept is not limited thereto.

The first elements E1 and the second elements E2 may cross each other and be integrated with each other. In an embodiment of the inventive concept, the first elements E1 may each extend in the first direction DR1, and the second elements E2 may each extend in the second direction DR2. The frame FM and the mask sheet MS may include the same material, e.g., invar. As the frame FM and the mask sheet MS have the same thermal expansion coefficient, distortion of the mask MSK in a deposition process may decrease. However, the inventive concept is not limited to the material of each of the frame FM and the mask sheet MS. In an embodiment of the inventive concept, the frame FM may be omitted. A shape of the mask sheet MS may be maintained by increasing a thickness of an outer element of the mask sheet MS.

A plurality of masks may be used to manufacture the display device DD described with reference to FIGS. 1 to 3. Although FIG. 6 is illustrated for explaining a basic shape of the mask MSK, all of the plurality of masks may not be the same as the mask MSK in FIG. 6. For example, the masks may include deposition openings having different surface areas. Additionally, the masks may include deposition openings having a different shape.

A first mask MSK1 and a second mask MSK2 including different shaped deposition openings M-OP1 and M-OP2 will be described with reference to FIG. 7A. The deposition openings M-OP1 and M-OP2 may correspond to the unit areas UA. The first mask MSK1 may be used to provide the second electrode CE described with reference to FIGS. 4A to 4C, and the second mask MSK2 may be used to provide the protection layer CPL described with reference to FIGS. 4A to 4C. Although the first mask MSK1 is described to be used for depositing a metal material as a first material, and the second mask MSK2 is described to be used for depositing an organic material as a second material in the present embodiment, the inventive concept is not limited thereto.

A first mask sheet MS1 includes first elements E1-1 and second elements E2-1, and a second mask sheet MS2 includes first elements E1-2 and second elements E2-2. Hereinafter, the first elements E1-2 and the second elements E2-2 of the second mask sheet MS2 will be described as third elements and fourth elements, respectively, for convenience of description. Each of the deposition openings M-OP1 of the first mask MSK1 may have a surface area different from that of each of the deposition openings M-OP2 of the second mask MSK2. The surface area difference causes a distance between edges of the protection layer CPL and the second electrode CE, as illustrated in FIG. 4A. When each of the deposition openings M-OP1 of the first mask MSK1 has a first surface area, each of the deposition openings M-OP2 of the second mask MSK2 may have a second surface area slightly greater than the first surface area.

As illustrated in FIG. 7A, a concave area CCA is defined in the first elements E1-1, and a convex area CVA is defined in the third elements E1-2. The concave area CCA and the convex area CVA are provided at positions corresponding to each other. When the first mask sheet MS1 and the second mask sheet MS2 are aligned with each other, the concave area CCA and the convex area CVA are disposed on the same line. When the concave area CCA and the convex area CVA are aligned on one line, the concave area CCA and the convex area CVA, disposed on another line, are also aligned.

When a metal material is deposited on the working substrate WS in the deposition equipment FA in FIG. 5 by using the first mask MSK1, the convex area CE-C of the second electrode CE is provided in correspondence to the concave area CCA of the first element E1-1. When an organic material is deposited on the working substrate WS in different deposition equipment FA by using the second mask MSK2, the concave area CPL-C of the protection layer CPL is provided in correspondence to the convex area CVA of the third element E1-2.

Although as illustrated in FIG. 4A, the first mask MSK1 and the second mask MSK2 are described for providing the second area R2 in an area extending in the first direction DR1, the concave area CCA and the convex area CVA may be provided to the second elements E2-1 of the first mask sheet MS1 and the fourth elements E2-2 of the second mask sheet MS2, respectively, to provide the second area R2 in an area extending in the second direction DR2.

As illustrated in FIG. 7B, a plurality of concave areas CCA may be provided in each of the deposition openings M-OP1, and a plurality of convex areas CVA may be provided in each of the deposition openings M-OP2. Here, two concave areas CCA and two convex areas CVA are exemplarily illustrated.

Additionally, the mask MSK including the linear first elements E1 and the linear second elements E2 in FIG. 6 may be used to provide the first encapsulation inorganic layer IOL1 and/or the second encapsulation inorganic layer IOL2 described with reference to FIGS. 4A to 4C. Since each of the first encapsulation inorganic layer IOL1 and/or the second encapsulation inorganic layer IOL2 does not include the inspection area, the concave area or the convex area are not necessary in the mask MSK for providing the first encapsulation inorganic layer IOL1 and the second encapsulation inorganic layer IOL2. In other words, each of the first elements E1 and the second elements E2 may have a uniform width.

Figure 8A:
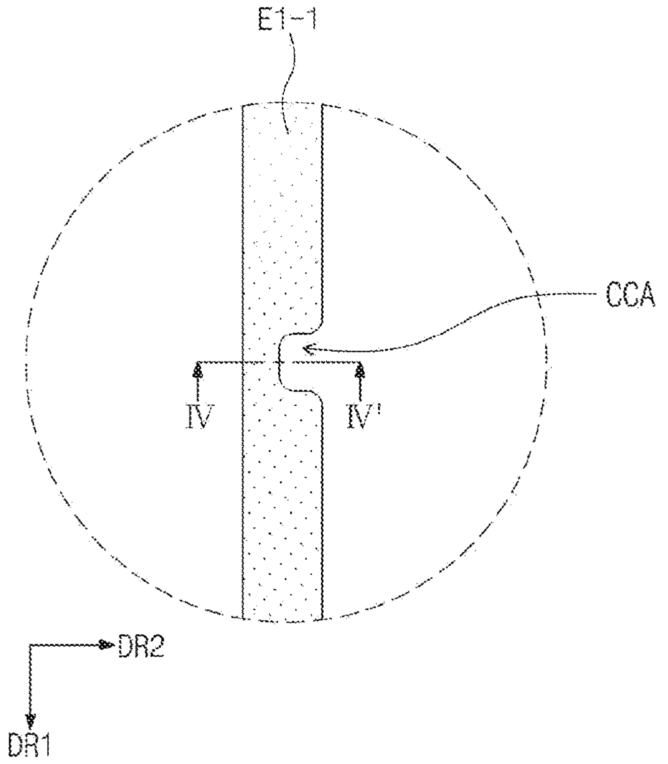
FIG. 8A is an enlarged plan view illustrating a portion of a first mask according to an embodiment of the inventive concept.
Figure 8B:
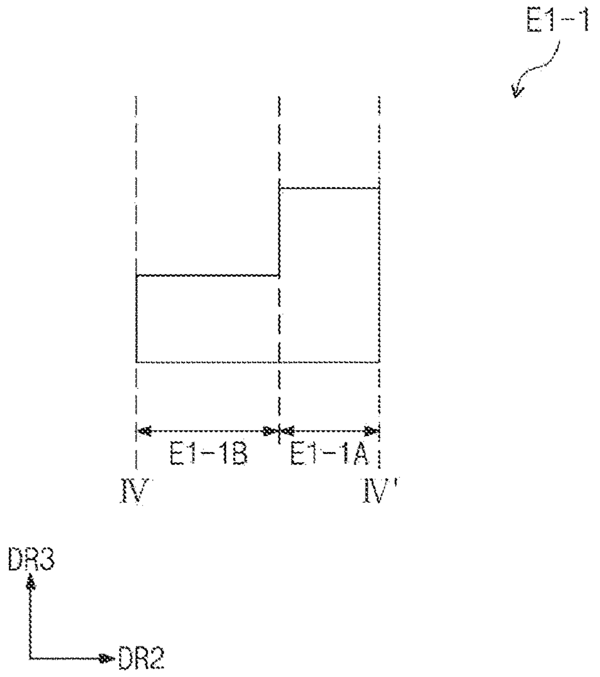
FIG. 8B is a cross-sectional view illustrating a portion of the first mask of FIG. 8A according to an embodiment of the inventive concept.
Figure 9A:
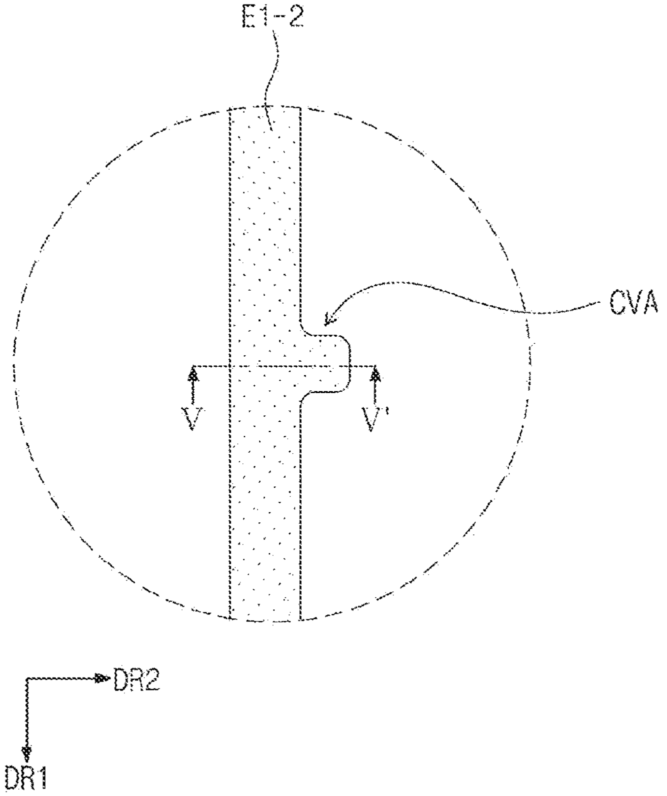
FIG. 9A is an enlarged plan view illustrating a portion of a second mask according to an embodiment of the inventive concept.
Figure 9B:
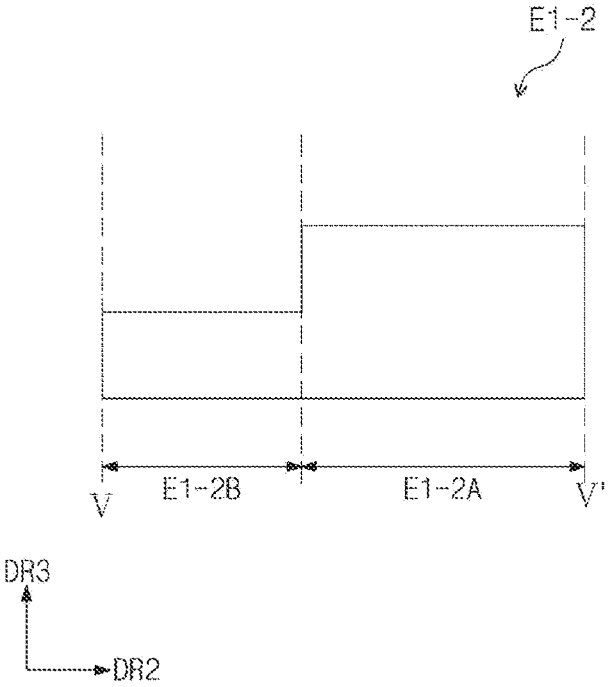
FIG. 9B is a cross-sectional view illustrating a portion of the second mask of FIG. 9A according to an embodiment of the inventive concept.

FIG. 8A is an enlarged plan view illustrating a portion of a first mask according to an embodiment of the inventive concept. FIG. 8B is a cross-sectional view illustrating a portion of the first mask of FIG. 8A according to an embodiment of the inventive concept. FIG. 8B illustrates a cross-section taken along a line IV-IV' of FIG. 8A. FIG. 9A is an enlarged plan view illustrating a portion of a second mask according to an embodiment of the inventive concept. FIG. 9B is a cross-sectional view illustrating a portion of the second mask of FIG. 9A according to an embodiment of the inventive concept. FIG. 9B illustrates a cross-section taken along a line V-V' of FIG. 9A.

As illustrated in FIGS. 8A and 8B, the first element E1-1 of the first mask MSK1 may include a first area E1-1A and a second area E1-1B, which have different thicknesses. The first area E1-1A may have a first thickness, and the second area E1-1B may have a second thickness less than the first thickness. The concave area CCA is disposed at the first area E1-1A that is opposite to the second area E1-1B. An edge defining the concave area CCA includes a curved area on a plane.

As illustrated in FIGS. 9A and 9B, the third element E1-2 of the second mask MSK2 may include a first area E1-2A and a second area E1-2B, which have different thicknesses. The first area E1-2A may have a first thickness, and the second area E1-2B may have a second thickness less than the first thickness. The convex area CVA is disposed in the first area E1-2A. An edge defining the convex area CVA includes a curved area on a plane. The curved area may be obtained by processing a metal sheet by using laser.

As each of the first mask MSK1 and the second mask MSK2 includes the second area E1-1B or E1-2B, a contact area between the working substrate WS and each of the first mask MSK1 and the second mask MSK2 may decrease. Referring to FIG. 5, a portion of each of the first mask MSK1 and the second mask MSK2 may be spaced apart from the working substrate WS, instead of the entire mask contacting the working substrate WS. As the contact area between the mask and the working substrate WS decreases, thermal deformation of the mask may be reduced.

According to an embodiment of the inventive concept, each of the second element E2-1 of the first mask MSK1 and the fourth element E2-2 of the second mask MSK2 may include an area having a different thickness. In other words, at least one of the longitudinal element and the transverse element of each of the first mask MSK1 and the second mask MSK2 may have an area having a different thickness. In an embodiment of the inventive concept, the longitudinal element and the transverse element of each of the first mask MSK1 and the second mask MSK2 may have the same thickness as each other.

According to an embodiment of the inventive concept, the deposition equipment FA may include a third mask configured to deposit a third material on each of the unit areas UA of the working substrate WS. The third mask may include fifth elements and sixth elements, and the fifth elements and the sixth elements may define a plurality of third deposition openings corresponding to the unit areas UA. Each of the fifth elements may have a uniform width, and each of the sixth elements may have a uniform width.

As described above, the edges of the laminated structure in the inspection area may be checked to determine whether a defect of the encapsulation organic layer OL is generated by inspecting with the naked eye.

Since the convex area CE-C is provided in the second electrode CE, the noise shielding area of the second electrode CE is not reduced. Thus, the signal generated from the display panel may be prevented from causing noise.

Additionally, since the concave area CPL-C is provided in the protection layer that is the organic layer CPL, the concave area CPL-C may be sufficiently sealed by the first encapsulation inorganic layer IOL1.

Although the inventive concept has been shown and described with reference to exemplary embodiments thereof, it will be apparent to those of ordinary skill in the art that various modifications in form and details may be made thereto without departing from the spirit and scope of the inventive concept as set forth by the appended claims.

What is claimed is:

1. A Manufacturing equipment comprising: a first mask configured to deposit a first material on each of unit areas of a working substrate; and a second mask configured to deposit a second material on each of the unit areas of the working substrate, wherein the first mask comprises a first mask sheet comprising first elements and second elements, and the first elements and the second elements define a plurality of first deposition openings corresponding to the unit areas, the second mask comprises a second mask sheet comprising third elements and fourth elements, and the third elements and the fourth elements define a plurality of second deposition openings corresponding to the unit areas, the first elements and the third elements each extend in a first direction, and the second elements and the fourth elements each extend in a second direction crossing the first direction, on a plane, a concave area is provided in at least each of the first elements or each of the second elements, and on the plane, a convex area is provided in at least each of the third elements or each of the fourth elements at a position corresponding to the concave area.

2. The manufacturing equipment of claim 1, wherein the first mask further comprises a first frame coupled to the first mask sheet, and the second mask further comprises a second frame coupled to the second mask sheet.

3. The manufacturing equipment of claim 2, wherein the first mask sheet and the first frame comprise a same material as each other.

4. The manufacturing equipment of claim 1, wherein at least the first elements or the second elements comprise a first area having a first thickness and a second area having a second thickness less than the first thickness.

5. The manufacturing equipment of claim 4, wherein the concave area is disposed in the first area.

6. The manufacturing equipment of claim 1, wherein each of the first elements has a length greater than that of each of the second elements.

7. The manufacturing equipment of claim 1, wherein each of the plurality of first deposition openings has a first surface area, and each of the plurality of second deposition openings has a second surface area different from the first surface area.

8. The manufacturing equipment of claim 1, wherein the first material comprises a metal material, and the second material comprises an organic material.

9. The manufacturing equipment of claim 1, further comprising a third mask configured to deposit a third material on each of the unit areas of the working substrate, wherein the third mask comprises fifth elements and sixth elements, and the fifth elements and the sixth elements define a plurality of third deposition openings corresponding to the unit areas.

10. The manufacturing equipment of claim 9, wherein each of the fifth elements has a uniform width, and each of the sixth elements has a uniform width.

* * * * *